United States Patent
Tsubouchi et al.

(10) Patent No.: US 10,236,844 B2
(45) Date of Patent: Mar. 19, 2019

(54) ACTIVE INDUCTOR AND AMPLIFIER CIRCUIT

(71) Applicant: Toshiba Memory Corporation, Minato-ku (JP)

(72) Inventors: Yuta Tsubouchi, Shinagawa (JP); Junji Wadatsumi, Ota (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/699,147

(22) Filed: Sep. 8, 2017

(65) Prior Publication Data

US 2018/0183395 A1 Jun. 28, 2018

(30) Foreign Application Priority Data

Dec. 28, 2016 (JP) .................................. 2016-256122

(51) Int. Cl.
*H03F 3/45* (2006.01)
*H03H 11/48* (2006.01)
*H03F 1/02* (2006.01)

(52) U.S. Cl.
CPC ....... *H03F 3/45273* (2013.01); *H03F 1/0205* (2013.01); *H03F 3/45183* (2013.01); *H03F 3/45219* (2013.01); *H03H 11/48* (2013.01); *H03F 2203/45021* (2013.01); *H03F 2203/45034* (2013.01)

(58) Field of Classification Search
CPC ...................................................... H03F 3/45
USPC ....................................... 330/257, 253, 261
See application file for complete search history.

(56) References Cited

U.S. PATENT DOCUMENTS

| | | | |
|---|---|---|---|
| 7,049,888 B2 * | 5/2006 | Soda ................... | H03F 3/45381 330/253 |
| 8,766,746 B2 * | 7/2014 | Nedovic ............... | H03H 11/48 333/213 |
| 2007/0216484 A1 * | 9/2007 | Redoute ................... | G05F 1/56 330/257 |

FOREIGN PATENT DOCUMENTS

| | | |
|---|---|---|
| JP | 62-188513 | 8/1987 |
| JP | 2004-343373 | 12/2004 |
| JP | 2015-170892 | 9/2005 |
| JP | 2009-212729 | 9/2009 |
| JP | 2013-70375 | 4/2013 |

* cited by examiner

*Primary Examiner* — Henry Choe
(74) *Attorney, Agent, or Firm* — Oblon, McClelland, Maier & Neustadt, L.L.P.

(57) ABSTRACT

According to an embodiment, an active inductor has a first conductivity type MOS transistor with a source that is connected to an electrical power source supply line and a drain that is connected to an output terminal. It has a capacitance between a gate of the first conductivity type MOS transistor and the electrical power source supply line. It has a diode element that is connected between a drain and a gate of the first conductivity type transistor. It has an electric current source that supplies a bias electric current in a forward direction to the diode element.

20 Claims, 4 Drawing Sheets

US 10,236,844 B2

ACTIVE INDUCTOR AND AMPLIFIER CIRCUIT

CROSS-REFERENCE TO RELATED APPLICATIONS

This application is based upon and claims the benefit of priority from Japanese Patent Application No. 2016-256122, filed on Dec. 28, 2016; the entire contents of which are incorporated herein by reference.

FIELD

The present embodiment generally relates to an active inductor and an amplifier circuit.

BACKGROUND

A technique has conventionally been disclosed for an active inductor that has a characteristic that corresponds to an inductor, by combining a passive element such as a resistor or a capacitor with an active element such as a transistor, and an amplifier circuit with such an active inductor that is provided as a load thereof.

A direct electric current electric voltage drop at a load of an amplifier circuit causes reduction of a dynamic range of such an amplifier circuit. Furthermore, a frequency characteristic of an amplifier circuit is influenced by a frequency characteristic of a load. Hence, an active inductor with a small electric voltage drop and a stable frequency characteristic is desired.

DETAILED DESCRIPTION

According to an embodiment, an active inductor has a first conductivity type MOS transistor with a source that is connected to an electrical power source supply line and a drain that is connected to an output terminal. It has a capacitance between a gate of the first conductivity type MOS transistor and the electrical power source supply line. It has a diode element that is connected between a drain and a gate of the first conductivity type transistor. It has an electric current source that supplies a bias electric current in a forward direction to the diode element.

Hereinafter, an active inductor and an amplifier circuit according to an embodiment will be described in detail, with reference to the accompanying drawings. Additionally, the present invention is not limited by such an embodiment.

First Embodiment

Figure 1:
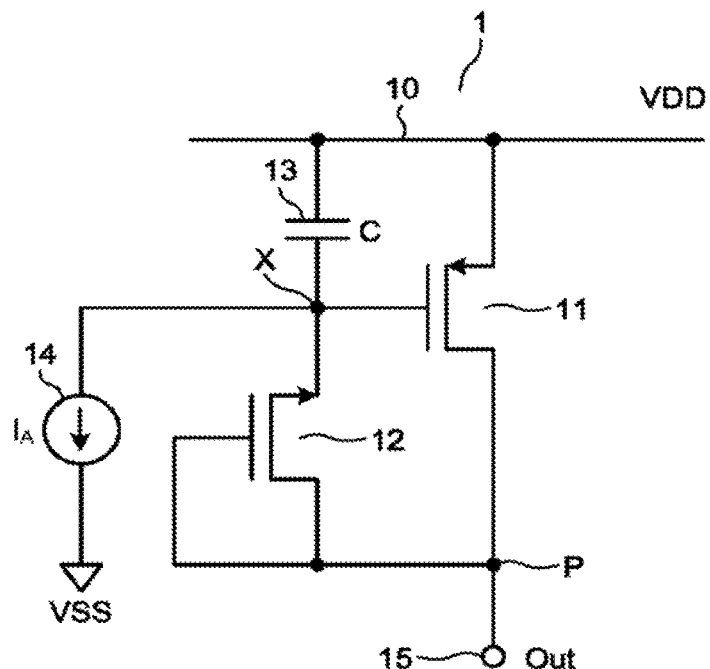
FIG. 1 is a diagram illustrating a configuration of an active inductor according to a first embodiment.

FIG. 1 is a diagram illustrating a configuration of an active inductor according to a first embodiment. An active inductor 1 according to the present embodiment includes a PMOS transistor 11 with a source that is connected to an electrical power source supply line 10 where an electrical power source electric voltage VDD is applied thereto. A drain of the PMOS transistor 11 is connected to an output terminal 15.

It has an NMOS transistor 12 that composes diode connection, between a gate and a drain of the PMOS transistor 11. The NMOS transistor 12 is provided with a drain and a gate that are connected to a drain of the PMOS transistor 11 and a source that is connected to a gate of the PMOS transistor 11. In a case where the NMOS transistor 12 composes a diode element, an electric current flows from a drain to a source of such an NMOS transistor so as to provide a forward bias state.

It has a capacitor 13 between a gate of the PMOS transistor 11 and the electrical power source supply line 10. The capacitor 13 may be composed of a capacitive element such as a capacitor or may be composed of a parasitic capacitance between a gate and a source of the PMOS transistor 11.

An electric current source 14 is connected to a source of the NMOS transistor 12. The electric current source 14 supplies a bias electric current in a forward direction to the NMOS transistor 12.

A small-signal impedance $Z_{A1}$ between the electric current source supply line 10 and the output terminal 15 according to the present embodiment is represented by a following formula (1).

$$Z_{A1} = \frac{1 + \frac{s \cdot C}{g_{mN}}}{g_{mP} + s \cdot C} \quad (1)$$

In formula (1), $g_{mP}$ demotes a transfer conductance of the PMOS transistor 11, $g_{mN}$ denotes a transfer conductance of the NMOS transistor 12, s denotes a Laplace transformation factor, and C denotes a capacitance value of the capacitor 13. From formula (1), it is possible to find that it has a characteristic of an active inductor.

An electric voltage drop $V_{PX}$ between a source and a drain of the NMOS transistor 12, that is, between a point P and a point X as illustrated in FIG. 1, is represented by a following formula (2). Additionally, the PMOS transistor 11 and the NMOS transistor 12 are operated in a saturation region.

$$V_{PX} = V_{thN} + \sqrt{\frac{2 \cdot I_A}{\mu_N \cdot C_{OX} \cdot W_N / L_N}} \quad (2)$$

In formula (2), $V_{thN}$ denotes a threshold value of the NMOS transistor 12, $\mu_N$ denotes a mobility of an electron, $C_{OX}$ denotes a thickness of a gate oxide film of the NMOS transistor 12, $W_N$ denotes a gate width, $L_N$ denotes a gate length, and $I_A$ denotes an electric current value of the electric current source 14. It is possible to ignore a gate electric current of the PMOS transistor 11, and hence, an electric current $I_A$ that is supplied from the electric current source 14 is substantially a bias electric current of the NMOS transistor 12.

Figure 2:
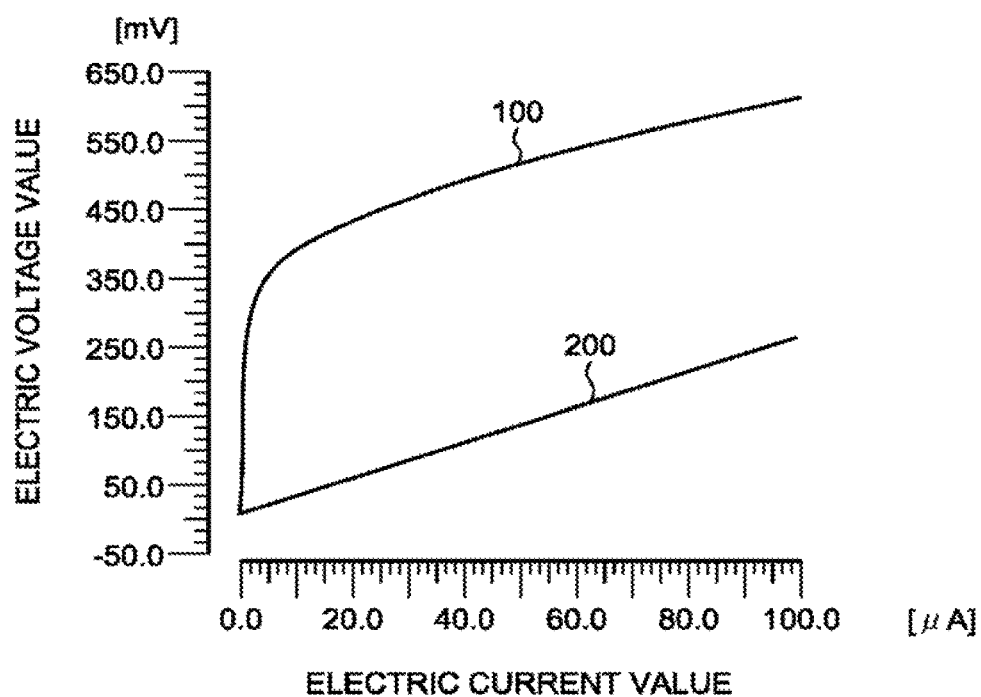
FIG. 2 is a diagram for illustrating a characteristic of an active inductor according to a first embodiment.

FIG. 2 is a diagram for illustrating a characteristic of an active inductor according to the first embodiment. A horizontal axis indicates an electric current value $I_A$ of the electric current source 14 and a vertical axis indicates a simulation result of an electric voltage drop $V_{PX}$ between the point P and the point X. In FIG. 2, a characteristic curve 100 indicates a simulation result of the active inductor 1. A characteristic curve 200 indicates a simulation result in a case where a resistor is connected instead of the NMOS transistor 12.

As indicated by the characteristic curve 100, it is possible for the active inductor 1 to obtain a large electric voltage drop even in a case where a bias electric current is small. An electric voltage drop $V_{PX}$ is an electric voltage that raises an electric potential at the point P with respect to an electric potential at the point X toward an electrical power source electric voltage VDD side. That is, an electric potential at the point P is higher than an electric potential at the point X by an electric voltage drop $V_{PX}$ caused by NMOS transistor 12. It is possible for the NMOS transistor 12 to generate a large electric voltage drop $V_{PX}$ as a small electric current, and hence, it is possible to suppress reduction of an electric voltage at the output terminal 15 efficiently. Thereby, in a case where the active inductor 1 is used as a load, it is possible to suppress a direct electric current electric voltage drop at such an load, and hence, it is possible to reduce an electrical power source electric voltage VDD so that it is possible to attain reduction of an electric voltage or reduction of an electrical power consumption.

An impedance $Z_{AI}$ of the active inductor 1 is represented by a capacitance C, a transfer conductance $g_{mP}$ of the PMOS transistor 11, and a transfer conductance $g_{mN}$ of the NMOS transistor 12 as indicated by formula (1). It is possible to adjust transfer conductances $g_{mP}$ and $g_{mN}$ by bias electric currents that are supplied to the PMOS transistor 11 and the NMOS transistor 12, respectively. Accordingly, a variation factor of an impedance $Z_{AI}$ is only a capacitance C, and hence, it is possible to provide a stable impedance. Thereby, in a case where the active inductor 1 is used as a load, circuit design is facilitated.

Additionally, as indicated by the characteristic curve 200 in a case where a configuration is provided by using a resistor, a bias electric current that flows through such a resistor is increased to raise an electric potential at the output terminal 15, so that it is possible to reduce an electric voltage drop caused by the active inductor 1. However, in such a case, an increase of a bias electric current causes an increase of electrical power consumption.

Second Embodiment

Figure 3:
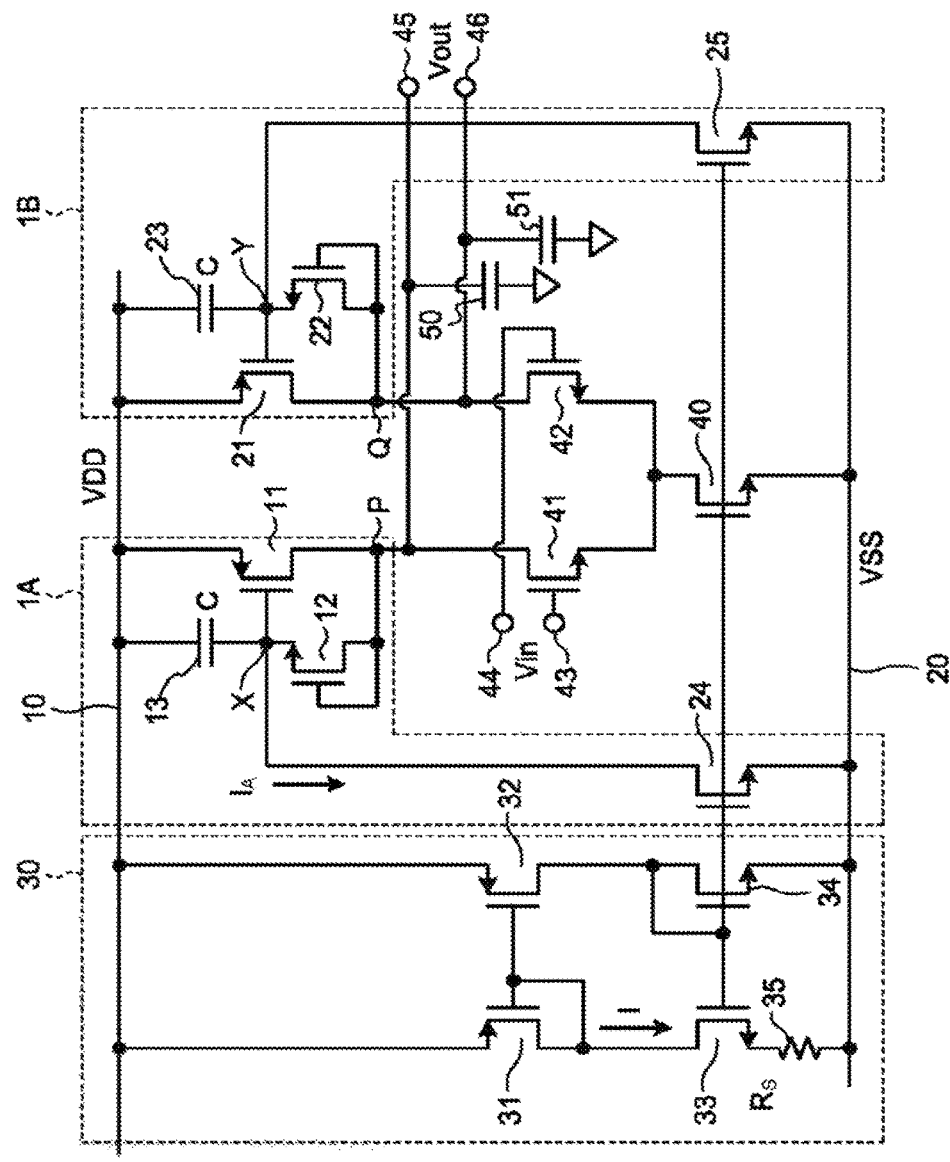
FIG. 3 is a diagram illustrating a configuration of a differential amplifier circuit according to a second embodiment.

FIG. 3 is a diagram illustrating a configuration of a differential amplifier circuit according to a second embodiment. A component that corresponds to that of the first embodiment will be provided with an identical symbol, and a redundant description thereof will be provided only in a case where it is needed. A similar matter applies to a latter part. A differential amplifier circuit according to the present embodiment has NMOS transistors 41, 42 with sources that are commonly connected to compose a differential pair between electrical power source supply lines 10, 20. A ground electric potential VSS is applied to the electrical power source supply line 20. An active inductor 1A as a load is connected to a drain of the NMOS transistor 41 and an active inductor 1B as a load is connected to a drain of the NMOS transistor 42.

The active inductors 1A, 1B have a configuration identical to that of the active inductor 1 as illustrated in FIG. 1. An NMOS transistor 24 of the active inductor 1A is connected between a capacitor 13 and the electrical power source supply line 20 and composes an electric current source that supplies a bias electric current $I_A$ in a forward direction to an NMOS transistor 12.

The active inductor 1B includes a PMOS transistor 21 with a source that is connected to the electrical power source supply line 10. A drain of the PMOS transistor 21 is connected to a signal output terminal 46. It has an NMOS transistor 22 that composes diode connection, between a gate and a drain of the PMOS transistor 21. The NMOS transistor 22 is provided with a drain and a gate that are connected to a drain of the PMOS transistor 21 and a source that is connected to a gate of the PMOS transistor 21.

It has a capacitor 23 between a gate of the PMOS transistor 21 and the electrical power source supply line 10. The capacitor 23 may be composed of a capacitive element such as a capacitor or may be composed of a parasitic capacitance between a gate and a source of the PMOS transistor 21.

A source of the NMOS transistor 22 is connected to a drain of an NMOS transistor 25. The NMOS transistor 25 is connected between the capacitor 23 and the electrical power source supply line 20 and composes an electric current source that supplies a bias electric current in a forward direction to the NMOS transistor 22. Due to the NMOS transistor 22, an electric voltage drop $V_{YQ}$ that is generated between a point Y and a point Q as illustrated in FIG. 3 acts to raise an electric potential at a drain of the PMOS transistor 21 toward an electrical power source electric voltage VDD side, and suppresses a direct electric current electric voltage drop caused by the active inductor 1B.

An NMOS transistor 40 is connected between a common source of the NMOS transistors 41, 42 and the electrical power source supply line 20 and supplies bias electric currents to the NMOS transistors, 41, 42. The NMOS transistors 24, 25, 40 are biased by a common bias circuit 30. Gates of the NMOS transistors 41, 42 are connected to signal input terminals 43, 44, respectively. Capacitors 50, 51 represent capacitive loads where output signals from signal output terminals 45, 46 are supplied thereto.

The bias circuit 30 has NMOS transistors 33 and 34 with commonly connected gates. Gates of the NMOS transistors 33, and gates of the NMOS transistors 24, 25, 40 are commonly connected to compose a current mirror circuit.

A resistor 35 is connected between a source of the NMOS transistor 33 and the electrical power source supply line 20. A drain of the NMOS transistor 33 is connected to a drain and a gate of a PMOS transistor 31. A source of the PMOS transistor 31 is connected to the electrical power source supply line 10. A drain of the NMOS transistor 34 is connected to a drain of a PMOS transistor 32. The transistor 32 is provided with a source that is connected to the electrical power source supply line 10 and a gate that is connected to a gate of the PMOS transistor 31.

The bias circuit 30 is of an electric voltage insensitive type that is not influenced by a variation of an electrical power source electric voltage VDD, and a drain electric current I of the NMOS transistor 33 is represented by formula (3).

$$I = \frac{2}{\mu_N \cdot C_{OX}} \cdot \frac{L_N}{W_N} \cdot \frac{1}{R_s^2} \cdot \left(1 - \frac{1}{\sqrt{K}}\right)^2 \qquad (3)$$

In formula (3), $\mu^N$ denotes a mobility of an electron, $C_{OX}$ denotes a thickness of a gate oxide film of the NMOS transistor 33, $W_N$ denotes a gate width, $L_N$ denotes a gate length, $R_s$ denotes a resistance value of the resistor 35, and K denotes a ratio of a surface area of the NMOS transistor 33 to that of the NMOS transistor 34.

On the other hand, a transfer conductance $g_m$ in a case where a bias electric current that is an electric current I flows through a MOS transistor is represented by formula (4).

$$g_m = \sqrt{2 \cdot \mu \cdot C_{OX} \cdot \frac{W}{L} \cdot I} \quad (4)$$

In formula (4), $C_{OX}$ denotes a thickness of a gate oxide film, W denotes a gate width, and L denotes a gate length. $\mu$ is a mobility of a carrier that is a mobility of an electron in a case of an NMOS transistor or a hole in a case of a PMOS transistor.

Formula (3) is substituted for formula (4), and thereby, a relation as represented by formula (5) is obtained.

$$g_m \alpha \frac{2}{R_s} \cdot \left(1 - \frac{1}{\sqrt{K}}\right) \quad (5)$$

The PMOS transistors 31 and 32 compose a current mirror circuit, and hence, in a case where such a surface area ratio is 1, an electric current that is equal to an electric current I flows through the PMOS transistor 32. Accordingly, a surface area ratio of the NMOS transistors 34, 24, 25, 40 is a predetermined ratio, and thereby, it is possible to supply electric currents with a predetermined ratio relative to an electric current I from the NMOS transistors 24, 25, 40 to the NMOS transistors 41, 42 and the NMOS transistors 12, 22.

An electric current I as represented by formula (3) is proportional to an inverse ($1/\mu_N$) of a mobility $\mu_N$ of a carrier (electron). A transfer conductance $g_m$ as represented by formula (4) is proportional to a mobility $\mu$ (a mobility $\mu_N$ of an electron in a case of an NMOS transistor), and hence, a term of a mobility $\mu$ of a carrier (electron) in a transfer conductance $g_m$ of an NMOS transistor is canceled by an electric current I to be supplied. That is, contribution of a mobility $\mu$ to a transfer conductance $g_m$ is canceled by supply of an electric current I.

Accordingly, it is possible to cause transfer conductances $g_m$ of the NMOS transistors 12, 22, 41, 42 to be stable values that are not influenced by a variation of an electric voltage. Moreover, a resistor with a small temperature coefficient is used as the resistor 35, and thereby, it is possible to obtain a transfer conductance $g_m$ with a less temperature change thereof.

Figure 4:
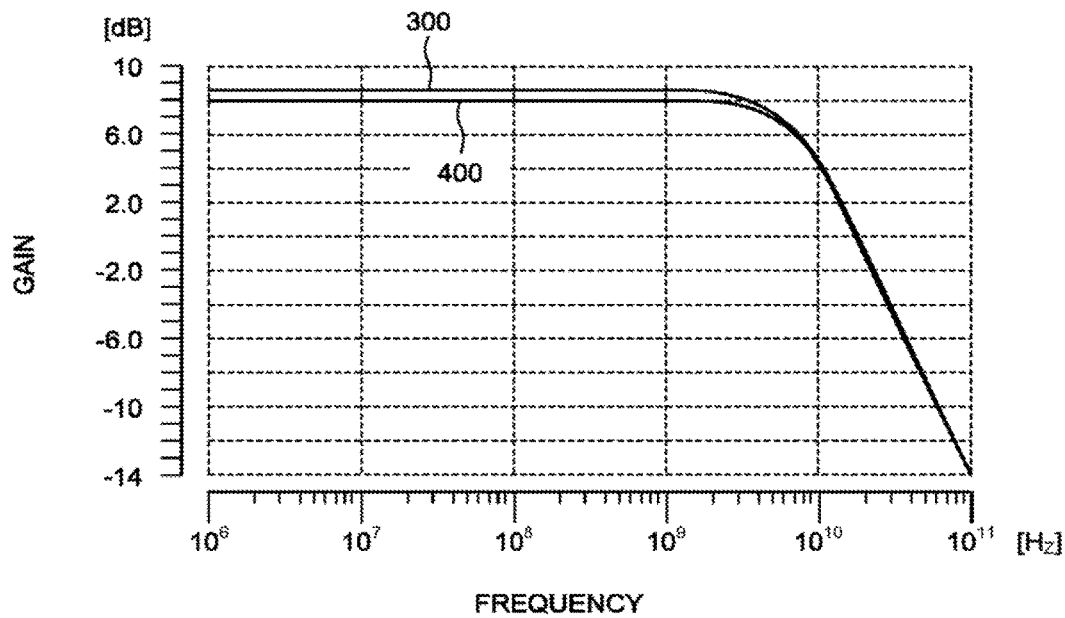
FIG. 4 is a diagram illustrating a frequency characteristic of a differential amplifier circuit according to a second embodiment.

FIG. 4 is a diagram illustrating a frequency characteristic of a differential amplifier circuit according to the second embodiment. A character curve 300 indicates a case where an electrical power source electric voltage VDD is 0.95 V and a temperature is 125° C., and a characteristic curve 400 indicates a case where an electrical power source electric voltage VDD is 1.05 V and a temperature is −25° C. Electric currents that cancel contribution of a mobility $\mu$ of a carrier to a transfer conductance $g_m$ are supplied to the NMOS transistors 12, 22, 41, 42, and thereby, transfer conductances $g_m$ of such NMOS transistors are stabilized. Thereby, it is possible to find that a frequency characteristic is indicated that is stable in a broad frequency band with respect to an electrical power source electric voltage VDD and a temperature change.

Furthermore, a small signal impedance $Z_{AI}$ of the active inductor 1 is represented by formula (1). Therefore, a zero-point frequency $f_0$ of the active inductor 1 is $g_{mN}/2\pi C$ and a pole frequency $f_p$ is $g_{mP}/2\pi C$. That is, it is possible to adjust any of the frequencies by transfer conductances $g_{mP}$, $g_{mN}$, and hence, it is possible to execute adjustment thereof by adjustment of bias electric currents that are supplied to the PMOS transistor 11 and the NMOS transistor 12. Accordingly, adjustment of a frequency characteristic of a differential amplifier circuit with an active inductor according to the present embodiment that is provided as a load thereof is facilitated.

Furthermore, electric voltage drops in the active inductors 1A, 1B are suppressed, and hence, it is possible to attain reduction of an electrical power source electric voltage VDD so that it is possible to reduce electrical power consumption.

Third Embodiment

Figure 5:
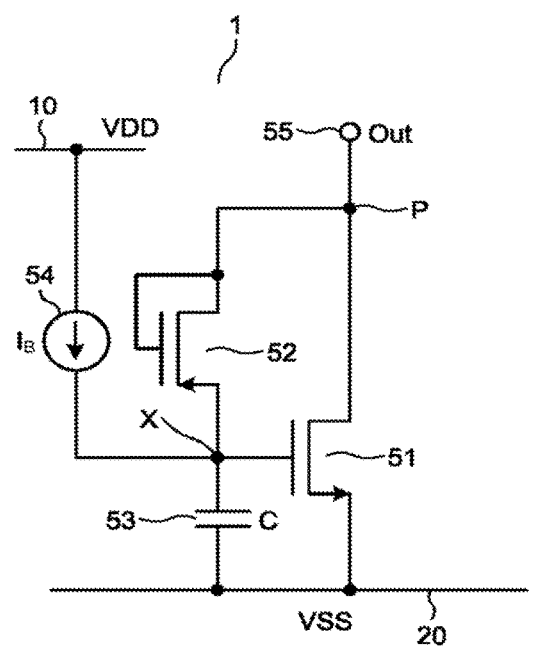
FIG. 5 is a diagram illustrating a configuration of an active inductor according to a third embodiment.

FIG. 5 is a diagram illustrating a configuration of an active inductor according to a third embodiment. An active inductor 1 according to the present embodiment has a configuration provided by replacing a conductivity type of a MOS transistor as illustrated in FIG. 1 that is a P type with an N type.

That is, the active inductor 1 includes an NMOS transistor 51 with a source that is connected to an electrical power source supply line 20. A drain of the NMOS transistor 51 is connected to an output terminal 55.

It has a PMOS transistor 52 that composes diode connection, between a gate and a drain of the NMOS transistor 51. The PMOS transistor 52 is provided with a drain and a gate that are connected to a drain of the NMOS transistor 51 and a source that is connected to a gate of the NMOS transistor 51. In a case where the PMOS transistor 52 composes a diode element, a state where an electric current flows from a source to a drain thereof is a forward bias state.

It has a capacitor 53 between a gate of the NMOS transistor 51 and the electrical powers source supply line 20. The capacitor 53 may be composed of a capacitive element such as a capacitor or may be composed of a parasitic capacitance between a gate and a source of the NMOS transistor 51.

A source of the PMOS transistor 52 is connected to an electric current source 54. The electric current source 54 supplies a bias electric current $I_B$ in a forward direction to the PMOS transistor 52.

In the active inductor 1, an electric potential at a gate of the NMOS transistor 51 is higher than an electric potential at a drain thereof, due to an electric voltage drop $V_{XP}$ of the PMOS transistor 52. In other words, an electric voltage drop $V_{XP}$ has a function of lowering an electric potential at a drain of the NMOS transistor 51 toward a ground, electric potential VSS side relative to an electric potential at a gate thereof. Thereby, it is possible to suppress a rise of an electric voltage at the output terminal 55. That is, it is possible to suppress a direct electric current electric voltage drop caused by the active inductor 1.

Similarly to the first embodiment, it is possible for the PMOS transistor 52 to generate a large electric voltage drop $V_{XP}$ due to a small bias electric current, and hence, it is possible to suppress a direct electric current electric voltage drop caused by the active inductor 1 efficiently.

Fourth Embodiment

Figure 6:
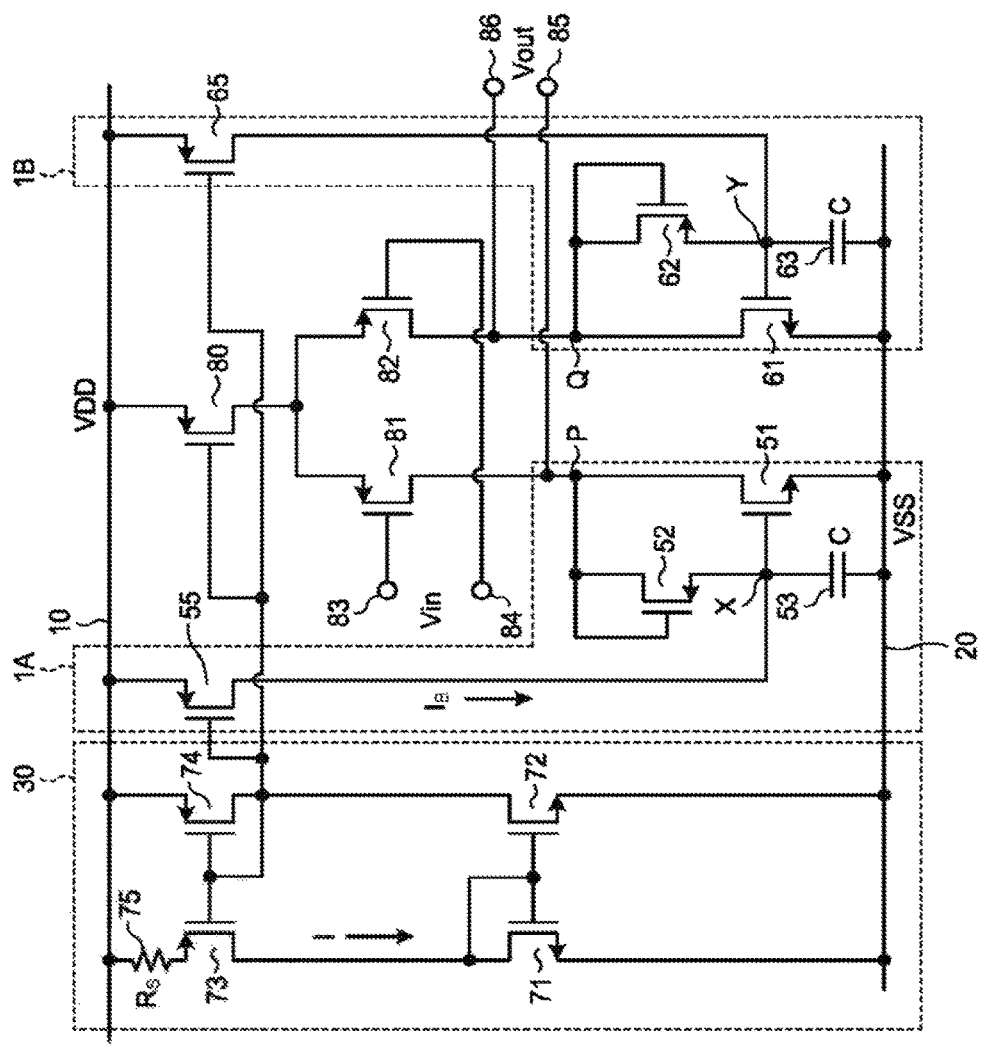
FIG. 6 is a diagram illustrating a configuration of a differential amplifier circuit according to a fourth embodiment.

FIG. 6 is a diagram illustrating a configuration of a differential amplifier circuit according to a fourth embodiment. In a differential amplifier circuit according to the present embodiment, the active inductor 1 of FIG. 5 is provided as a load.

A differential amplifier circuit according to the present embodiment has PMOS transistors 81, 82 with sources that are commonly connected to compose a differential pair. Gates of PMOS transistors 81, 82 are connected to signal input terminals 83, 84. A drain of the PMOS transistor 81 is connected to an active inductor 1A as a load and a drain of the PMOS transistor 82 is connected to an active inductor 1B as a load.

The electric current source 54 that supplies an electric current $I_B$ is composed of a PMOS transistor 55. A drain of an NMOS transistor 51 is connected to a signal output terminal 85. The active inductor 1B has an NMOS transistor 61, PMOS transistors 62, 65, and a capacitor 63. A source of the NMOS transistor 61 is connected to an electrical power source supply line 20. A drain of the NMOS transistor 61 is connected to a signal output terminal 86.

It has the PMOS transistor 62 that composes diode connection, between a gate and a drain of the NMOS transistor 61. The PMOS transistor 62 is provided with a drain and a gate that are connected to a drain of the NMOS transistor 61 and a source that is connected to a gate of the NMOS transistor 61.

The capacitor 63 is connected between a gate of the NMOS transistor 61 and the electrical power source supply line 20. The capacitor 63 may be composed of a capacitive element such as a capacitor or may be composed of a parasitic capacitance between a gate and a source of the NMOS transistor 61.

A source of the PMOS transistor 62 is connected to a drain of the PMOS transistor 65. The PMOS transistor 65 composes an electric current source that supplies a bias electric current in a forward direction to the PMOS transistor 62.

PMOS transistors 80, 55, 65 are biased by a common bias circuit 30.

That is, the bias circuit 30 has PMOS transistors 73 and 74 with commonly connected gates. A resistor 75 is connected between a source of the PMOS transistor 73 and an electrical power source supply line 10.

A drain of the PMOS transistor 73 is connected to a drain and a gate of an NMOS transistor 71. A source of the NMOS transistor 71 is connected to the electrical power source supply line 20. A drain of the PMOS transistor 74 is connected, to a drain of ah NMOS transistor 72. The NMOS transistor 72 is provided with a source that is connected to the electrical power source supply line 20 and a gate that is connected to a gate of the NMOS transistor 71.

A differential amplifier circuit according to the present embodiment has the PMOS transistors 81, 82 with the active inductors 1A, 1B that axe provided as loads. Electric potentials at drains of the NMOS transistors 51, 61 are lowered toward a ground electric potential VSS side by electric voltage drops of PMOS transistors 52, 62, and thereby, electric voltage drops at the active inductors 1A, 1B are suppressed. Accordingly, it is possible to lower direct electric current electric potentials at the signal output terminals 85, 86 to broaden a dynamic range, and hence, it is possible to attain reduction of an electrical power source electric voltage VDD. Thereby, it is possible to suppress electrical power consumption of a differential amplifier circuit.

In the present embodiment, it is possible to represent an electric current I that flows through the PMOS transistor 73 by formula (3) where a mobility $\mu_N$ is replaced with a mobility $\mu_P$ of a hole, $C_{OX}$, $W_N$, and $L_N$ are replaced with a thickness of a gate oxide film, a gate width, and a gate length of the PMOS transistor 73, respectively, $R_s$ is a resistance value of the resistor 75, and K is a ratio of a surface area of the PMOS transistor 73 to that of the PMOS transistor 74.

It is possible to represent transfer conductances $g_m$ of the PMOS transistors 52, 62, 81, 82 by formula (4) where a mobility $\mu$ is replaced with a mobility $\mu_P$ of a hole.

It is possible to supply electric currents that have a predetermined ratio relative to an electric current I that flows through the PMOS transistor 73 to the PMOS transistors 52, 62, 81, 82, due to the PMOS transistors 74, 55, 65, 80, respectively, and hence, it is possible to cause transfer conductances $g_m$ of such PMOS transistors 52, 62, 81, 82 to be a stable value that is not dependent on an electrical power source electric voltage VDD.

That is, electric currents that are supplied from the PMOS transistors 55, 65, 80 that are biased by the bias circuit 30 supply electric currents that cancel contribution of a mobility $\mu$ of a carrier (hole) to transfer conductances $g_m$ of the PMOS transistors 52, 62, 81, 82, and hence, it is possible to stabilize transfer conductances $g_m$ of such PMOS transistors 52, 62, 81, 82. Thereby, it is possible to stabilize a circuit operation of a differential amplifier circuit. It is possible to obtain a transfer conductance $g_m$ with a less temperature change thereof by using a resistor with a small temperature coefficient as she resistor 75, and hence, it is possible to stabilize a circuit operation of a differential amplifier circuit. Thereby, a differential amplifier circuit that has a stabilized frequency characteristic is provided similarly to the second embodiment.

The number of diode-connected MOS transistors is not limited to one. For example, multiple diode-connected MOS transistors are connected in series, and thereby, it is possible to adjust an electric potential at an output terminal of an active inductor. It is also possible to use diode connection that connects a base and an emitter of a bipolar transistor, instead of a diode-connected MOS transistor.

Furthermore, a configuration with an active inductor that is provided as a load is not limited to a differential amplifier circuit. For example, it is also possible to compose an amplifier circuit in such a manner that the active inductor 1 according to an embodiment as a load is connected to a drain of a MOS transistor with a gate that receives an input signal and an output signal is output from an output terminal that is connected to a drain of such a MOS transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An active inductor, comprising:
a first conductivity type first MOS transistor with a source, that is connected to an electrical power source supply line and a drain that is connected to an output terminal;
a capacitance between a gate of the first conductivity type first MOS transistor and the electrical power source supply line;
a diode element that is connected between the drain and the gate of the first conductivity type first MOS transistor; and
an electric current source that supplies a bias electric current in a forward direction to the diode element.

2. The active inductor according to claim 1, wherein the diode element includes a second conductivity type second MOS transistor with a drain and a gate that are connected to the drain of the first conductivity type first MOS transistor and a source that is connected to the gate of the first conductivity type first MOS transistor.

3. The active inductor according to claim 2, wherein the electric current source supplies an electric current that cancels contribution of a mobility of a carrier to a transfer conductance of the second conductivity type second MOS transistor.

4. The active inductor according to claim 2, wherein an electrical power source electrical voltage is applied to the electrical power source supply line, the first conductivity type first MOS transistor is composed of a PMOS transistor, and the second conductivity type second MOS transistor is composed of an NMOS transistor.

5. The active inductor according to claim 2, wherein a ground electrical voltage is applied to the electrical power source supply line, the first conductivity type first MOS transistor is composed of an NMOS transistor, and the second conductivity type second MOS transistor is composed of a PMOS transistor.

6. The active inductor according to claim 4, wherein the electric current source includes:
a third NMOS transistor with a drain that is connected to the gate of the first conductivity type first MOS transistor and a source that is supplied with a ground electric voltage; and
a bias circuit that supplies a bias electric voltage to a gate of the third NMOS transistor,
wherein the bias circuit includes:
a fourth NMOS transistor with a gate that is connected to a gate of the third NMOS transistor and a source that is connected to a second electrical power source supply line where the ground electric voltage is applied thereto;
a fifth NMOS transistor with a gate that is connected to the gate of the fourth NMOS transistor and a source that is connected to the second electrical power source supply line through a resistance element;
a sixth PMOS transistor with s drain that is connected to the gate and a drain of the fourth NMOS transistor and a source that is connected to the electrical power source supply line, and
a seventh PMOS transistor with a drain and a gate that are connected to a drain of the fifth NMOS transistor, a source that is connected to the electrical power source supply line, and the gate that is connected to a gate of the sixth PMOS transistor.

7. The active inductor according to claim 5, wherein the electric current source includes:
a third PMOS transistor with a drain that is connected to the gate of the first conductivity type first MOS transistor and a source where an electrical power source electric voltage is applied thereto; and
a bias circuit that supplies a bias electric voltage to a gate of the third PMOS transistor,
wherein the bias circuit includes:
a fourth PMOS transistor with a gate that is connected to a gate of the third PMOS transistor and a source that is connected to a second electrical power source supply line where the electrical power source electric voltage is applied thereto;
a fifth PMOS transistor with a gate that is connected to the gate of the fourth PMOS transistor and a source that is connected to the second electrical power source supply line through a resistance element;
a sixth NMOS transistor with a drain that is connected to the gate and a drain of the fourth PMOS transistor and a source that is connected to the electrical power source supply line; and
a seventh NMOS transistor with a drain and a gate that are connected to a drain of the fifth PMOS transistor, a source that is connected to the electrical power source supply line, and the gate that is connected to a gate of the sixth NMOS transistor.

8. The active inductor according to claim 1, wherein the capacitance is a parasitic capacitance between the gate and the source of the first conductivity type first MOS transistor.

9. The active inductor according to claim 1, wherein the capacitance is composed of a capacitive element.

10. An amplifier circuit with the active inductor according to claim 1 that is provided as a load thereof.

11. The amplifier circuit according to claim 10, comprising a second conductivity type second MOS transistor with a gate that is supplied with an input signal, a drain that is connected to the active inductor, and a source that is supplied with a bias electric current.

12. The amplifier circuit according to claim 10, wherein the amplifier circuit is a differential amplifier circuit that includes:
a first load that has a configuration of the active inductor;
a second load that has a configuration of the active inductor;
a second conductivity type second MOS transistor with a drain that is connected to the first load and a gate that is connected to a first signal input terminal;
a second conductivity type third MOS transistor with a drain that is connected to the second load and a gate that is connected to a second signal input terminal;
an electric current source that supplies a bias electric current to a source of the second conductivity type second MOS transistor and a source of the second conductivity type third MOS transistor;
a first signal output terminal that is connected to the drain of the second conductivity type second MOS transistor; and
a second signal output terminal that is connected to the drain of the second conductivity type third MOS transistor.

13. The amplifier circuit according to claim 12, wherein the electric current source that supplies the bias electric current to the source of the second conductivity type second MOS transistor and the source of the second conductivity type third MOS transistor includes:
a second conductivity type fourth MOS transistor with a drain that is connected to the source of the second conductivity type second MOS transistor and the source of the second conductivity type third MOS transistor; and
a bias circuit that supplies a bias electric voltage to a gate of the second conductivity type fourth MOS transistor.

14. An amplifier circuit, comprising:
a first electrical power source supply line where a first electric voltage is applied thereto;
a second electrical power source supply line where a second electric voltage is applied thereto;
a bias circuit that is driven by an electric voltage between the first electrical power source supply line and the second electrical power source supply line and generates a predetermined bias electric voltage;
a first conductivity type first MOS transistor, a first conductivity type second MOS transistor, and a first conductivity type third MOS transistor, where biasing between gates and sources thereof is executed by the predetermined bias electric voltage of the bias circuit;
a first conductivity type fourth MOS transistor with a source that is connected to a drain of the first conductivity type first MOS transistor, a gate that is connected to a second signal input terminal, and a drain that is connected to a first signal output terminal;
a first conductivity type fifth MOS transistor with a source that is connected to a drain of the first conductivity type first MOS transistor, a gate that is connected to a second signal input terminal, and a drain that is connected to a second signal output terminal;
a first active inductor that is connected between the drain of the first conductivity type fourth MOS transistor and the first electrical power source supply line; and
a second active inductor that is connected between the drain of the first conductivity type fifth MOS transistor and the first electrical power source supply line;
wherein the first active inductor includes:
a second conductivity type sixth MOS transistor with a source that is connected to the first electrical power source supply line, a drain that is connected to the drain of the first conductivity type fourth MOS transistor, and a gate that is con nee ted to a drain of the first conductivity type second MOS transistor;
a first capacitance between the gate of the second conductivity type sixth MOS transistor and the first electrical power source supply line; and
a first diode element that is connected between the drain and the gate of the second conductivity type sixth MOS transistor, and
wherein the second active inductor includes:
a second conductivity type seventh MOS transistor with a source that is connected to the first electrical power source supply line, a drain that is connected to the drain of the first conductivity type fifth MOS transistor, and a gate that is connected to a drain of the first conductivity type third MOS transistor;
a second capacitance between the gate of the second conductivity type seventh MOS transistor and the first electrical power source supply line; and
a second diode element that is connected between the drain and the gate of the second conductivity type seventh MOS transistor.

15. The amplifier circuit according to claim 14, wherein:
the first capacitance of the first active inductor is composed of a parasitic capacitance between the gate and the source of the second conductivity type sixth MOS transistor, and
the second capacitance of the second active inductor is composed of a parasitic capacitance between the gate and the source of the second conductivity type seventh MOS transistor.

16. The amplifier circuit according to claim 14, wherein:
the first diode element of the first active inductor includes a first conductivity type eighth MOS transistor with a drain and a gate that are connected to the drain of the second conductivity type sixth MOS transistor and a source that is connected to the gate of the second conductivity type sixth MOS transistor; and
the second diode element of the second active inductor includes a first conductivity type ninth MOS transistor with a drain and a gate that are connected to the drain of the second conductivity type seventh MOS transistor and a source that is connected to the gate of the second conductivity type seventh MOS transistor.

17. The amplifier circuit according to claim 14, wherein:
an electrical power source electric voltage is applied to the first electrical power source supply line;
a ground electric voltage is applied to the second electrical power source supply line;
the first conductivity type first to fifth MOS transistors are composed of NMOS transistors;
the second conductivity type sixth and seventh MOS transistors are composed of PMOS transistors.

18. The amplifier circuit according to claim 14, therein:
a ground electric voltage is applied to the first electrical power source supply line;
an electrical power source electric voltage is applied to the second electrical power source supply line;
the first conductivity type first to fifth MOS transistors are composed of PMOS transistors;
the second conductivity type sixth and seventh MOS transistors are composed of NMOS transistors.

19. The amplifier circuit according to claim 17, wherein the bias circuit includes:
a first conductivity type eighth MOS transistor with a gate that is connected to gates of the first conductivity type first to third MOS transistors and a source that is connected to the second electrical power source supply line;
a first conductivity type ninth MOS transistor with a gate that is connected to the gate of the first conductivity type eighth MOS transistor and a source that is connected to the second electrical power source supply line through a resistance element;
a second conductivity type tenth MOS transistor with a drain that is connected to the gate and a drain of the eighth MOS transistor and a source that is connected to the first electrical power source supply line; and
a second conductivity type eleventh MOS transistor with a drain and a gate that are connected to a drain of the ninth MOS transistor, a source that is connected to the first electrical power source supply line, and the gate that is connected to a gate of the second conductivity type tenth MOS transistor.

20. The amplifier circuit according to claim 18, wherein the bias circuit includes:
a first conductivity type eighth MOS transistor with a gate that is connected to gates of the first conductivity type first to third MOS transistors and a source that is connected to the second electrical power source supply line;
a first conductivity type ninth MOS transistor with a gate that is connected to the gate of the first conductivity type eighth MOS transistor and a source that is connected to the second electrical power source supply line through a resistance element;

a second conductivity type tenth MOS transistor with a drain that is connected to the gate and a drain of the eighth MOS transistor end a source that is connected to the first electrical power source supply line; and a second conductivity type eleventh MOS transistor with a drain and a gate that are connected to a drain of the first conductivity type ninth MOS transistor, a source that is connected to the first electrical power source supply line, and a gate that is connected to a gate of the second conductivity type tenth MOS transistor.

* * * * *